United States Patent
Li

(10) Patent No.: US 7,347,250 B2
(45) Date of Patent: Mar. 25, 2008

(54) LOOP HEAT PIPE

(75) Inventor: Jia-Hao Li, Sindian (TW)

(73) Assignee: Jaffe Limited, Tortola (VG)

( * ) Notice: Subject to any disclaimer, the term of this patent is extended or adjusted under 35 U.S.C. 154(b) by 217 days.

(21) Appl. No.: 11/341,468

(22) Filed: Jan. 30, 2006

(65) Prior Publication Data

US 2007/0175615 A1 Aug. 2, 2007

(51) Int. Cl.
*H05K 7/20* (2006.01)
(52) U.S. Cl. ............... 165/104.26; 165/104.33; 361/700
(58) Field of Classification Search ........... 165/104.21, 165/104.26, 104.33; 361/700
See application file for complete search history.

(56) References Cited

U.S. PATENT DOCUMENTS

| | | | | |
|---|---|---|---|---|
| 6,450,132 B1 * | 9/2002 | Yao et al. | ............. | 122/366 |
| 6,981,543 B2 * | 1/2006 | Chesser et al. | ........ | 165/104.26 |
| 7,007,746 B2 * | 3/2006 | Wu et al. | ............. | 165/104.26 |
| 7,231,961 B2 * | 6/2007 | Alex et al. | ............. | 165/80.4 |
| 2002/0195230 A1 * | 12/2002 | Li | ............. | 165/104.33 |
| 2004/0206480 A1 * | 10/2004 | Maydanik et al. | ..... | 165/104.26 |
| 2005/0252643 A1 * | 11/2005 | Kroliczek et al. | ..... | 165/104.26 |
| 2006/0016580 A1 * | 1/2006 | Lee et al. | ............. | 165/104.26 |
| 2006/0283577 A1 * | 12/2006 | Liu et al. | ............. | 165/104.26 |
| 2007/0006992 A1 * | 1/2007 | Liu et al. | ............. | 165/104.26 |
| 2007/0006994 A1 * | 1/2007 | Liu et al. | ............. | 165/104.26 |

FOREIGN PATENT DOCUMENTS

TW 92130196 10/2003

* cited by examiner

*Primary Examiner*—Allen J. Flanigan

(57) ABSTRACT

A loop heat pipe includes an evaporator, a liquid seal container and a closed loop. The evaporator includes an evaporator body made of a heat conductive material. The evaporator body includes at least two retaining holes and at least a channel hole penetrating the retaining holes. The liquid seal container is secured fastened to one of the retaining holes of the evaporator. A capillary structure is adhered to the inner wall of the liquid seal container. One end of the liquid seal container forms a liquid seal region using the capillary structure. The closed loop includes at least two closed ends. One of the closed ends is securely fastened to the other retaining hole of the evaporator, while the other closed end is communicably connected to the liquid seal region of the liquid seal container.

14 Claims, 4 Drawing Sheets

LOOP HEAT PIPE

BACKGROUND OF THE INVENTION

The present invention relates generally to a loop heat pipe, and more particularly to an evaporator of the loop heat pipe.

A loop heat pipe is a heat exchange system, wherein both the liquid and gas phases of the working fluid flow along the same direction. The working principle of the loop heat pipe is similar to that of the conventional heat pipe. However, the loop heat pipe does not comprise the drawback that the liquid phase of the working fluid flows along a direction opposite to that of the gas working fluid. Therefore, the performance of the loop heat pipe is much better than that of the conventional heat pipe.

One conventional loop heat pipe is disclosed in Taiwanese Patent Application No. 92130196, entitled "method for manufacturing evaporator of loop heat pipe." Although the primary subject matter disclosed in this application publication pertains to a method for manufacturing an evaporator of loop heat pipe, one can easily realize by viewing the appended figures that the evaporator of loop heat pipe is configured such that one side thereof is connected to an incoming pipe, while the other side thereof is connected to an outgoing pipe. After the pipes and the evaporator form a loop, it is very difficult to clean, evacuate or exhaust the internal part of the pipes. Therefore, the cleanness and the degree of vacuum of the pipes become uncontrollable, which will affect the performance of heat transfer. In addition, the evaporator of the application publication is composed of two external pipes, which requires an adhesion or a welding procedure to tightly connect the external pipes onto the evaporator. However, the adhesion or the welding procedure requires that the welding torch or the glue gun be surrounding the edge of the two external pipes. In this manner, the loop heat pipe will interfere the welding or the adhesion procedure.

On the other hand, one can use a detachable torch to prevent the interference of the loop heat pipe during the welding procedure using the torch. However, the detachable torch requires additional steps for detaching and assembling the torch, which will largely slow down the production speed. Moreover, one can also use a soldering procedure to replace the welding procedure. However, the melted soldering material can flow into the pipe, which will be absorbed by the capillary structure, thereby clogging the capillary structure.

Accordingly, the inventor of the present invention realized the drawbacks in the conventional art, and developed the present invention that can overcome the drawbacks described above.

BRIEF SUMMARY OF THE INVENTION

The present invention is to provide a loop heat pipe, which includes an evaporator, a liquid seal container and a closed loop. The connection of the evaporator and the closed loop can ease the operation for cleaning, evacuating or exhausting the loop heat pipe before sealing. Furthermore, the convenient connection procedure of the evaporator and the closed loop will enhance the performance of the sealing operation.

Accordingly, the loop heat pipe of the present invention includes an evaporator, a liquid seal container and a closed loop. The evaporator includes an evaporator body made of a heat conductive material. The evaporator body includes at least two retaining holes and at least a channel hole penetrating the retaining holes. The liquid seal container is secured fastened to one of the retaining holes of the evaporator. A capillary structure is adhered to the inner wall of the liquid seal container. One end of the liquid seal container forms a liquid seal region using the capillary structure. The closed loop includes at least two closed ends. One of the closed ends is securely fastened to the other retaining hole of the evaporator, while the other closed end is communicably connected to the liquid seal region of the liquid seal container.

DETAILED DESCRIPTION OF THE INVENTION

In order to better understanding the features and technical contents of the present invention, the present invention is hereinafter described in detail by incorporating with the accompanying drawings. However, the accompanying drawings are only for the convenience of illustration and description, no limitation is intended thereto.

Figure 1:
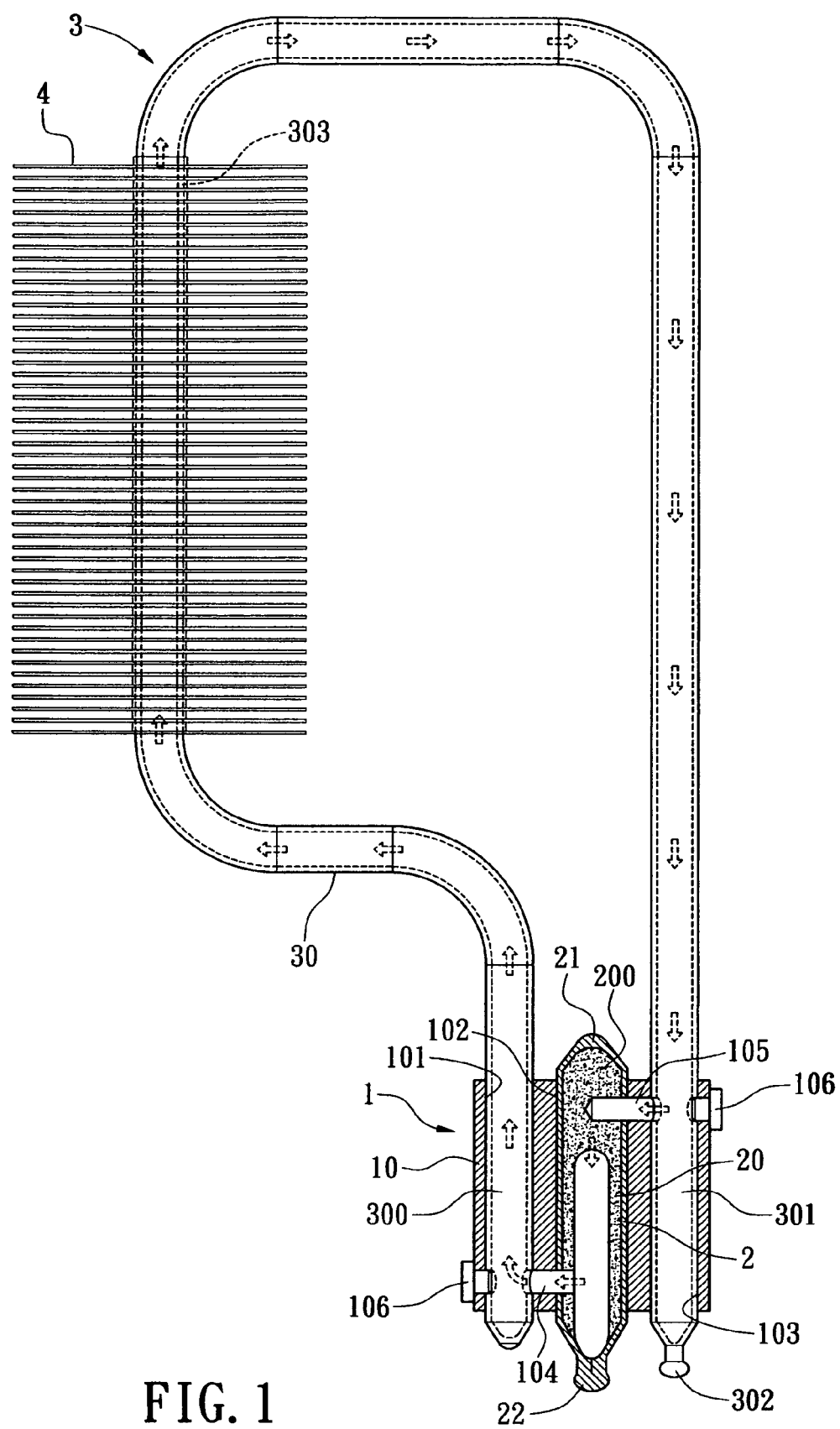
FIG. 1 is a sectional view illustrating a loop heat pipe in accordance with the first embodiment of the present invention.

Referring to FIG. 1, a loop heat pipe in accordance with the first embodiment of the present invention is illustrated. As shown, the loop heat pipe includes an evaporator 1, a liquid seal container 2 and a sealed pipe 3.

Figure 3:
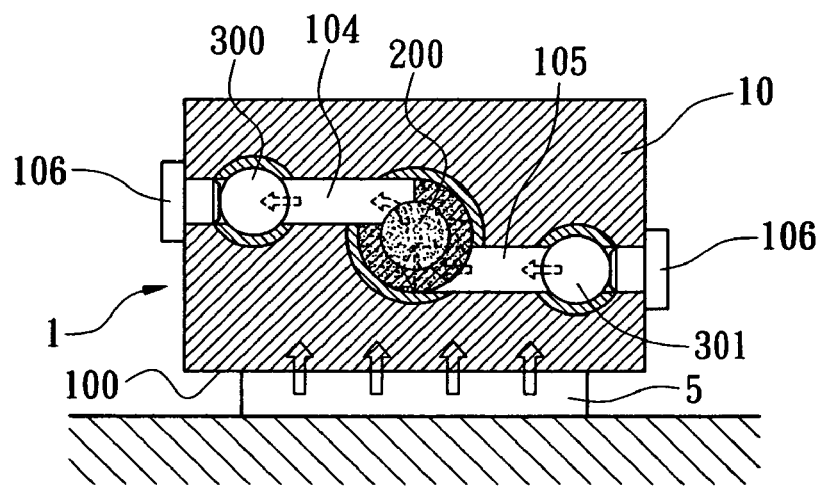
FIG. 3 illustrates the evaporator of the loop heat pipe of the present invention in another viewing angle.

The evaporator 1 is the portion that the loop heat pipe absorbs heat. The evaporator 1 includes a evaporator body 10, which is made of a heat conductive material, e.g. aluminum or copper. Therefore, the evaporator body 10 is substantially a heat spreader, which includes a contact surface 100 (as shown in FIG. 3) provided for contacting with a heat source 5. The heat source 5 is a heat generating electronic device. In one embodiment, the heat source 4 refers to a central processing unit. In addition, at least a first retaining hole 101, a second retaining hole 102 and a third retaining hole 103 are formed on the evaporator body 10. Furthermore, at least a channel hole 104, 105 is formed penetrating any pair of the retaining holes 101, 102, 103. As shown in this particular embodiment, a channel hole 104 is formed penetrating the first and the second retaining holes 101, 102, while the channel hole 105 is formed penetrating the second and the third retaining holes 102, 103.

Figure 2:
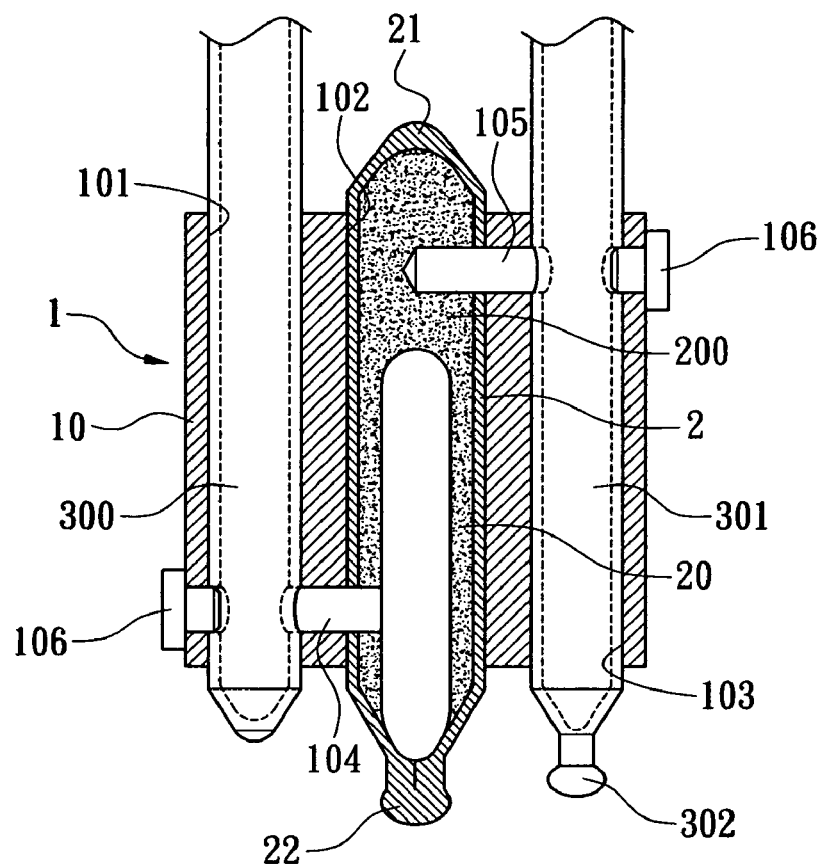
FIG. 2 is a partially enlarged view of an evaporator of the loop heat pipe of the present invention.
Figure 4:
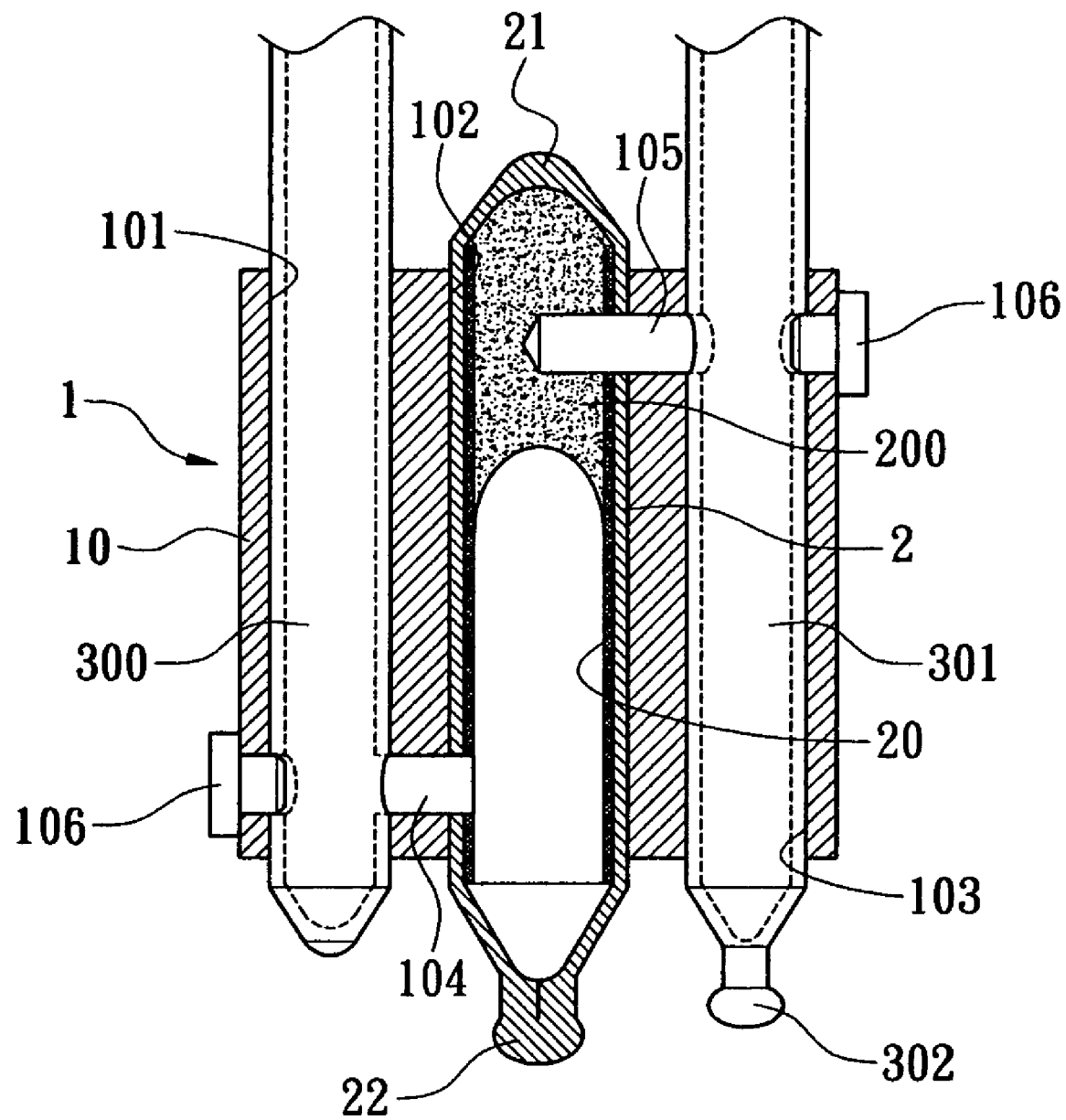
FIG. 4 illustrates the evaporator, in accordance with the second embodiment of the present invention.

Referring also to FIG. 2, the liquid seal container 2 can be a heat pipe, which is inserted into the second retaining hole 102 of the evaporator body 1. The liquid seal container 2 is securely fastened to the second retaining hole 102 by using a heat conductive soldering material or adhesive, such as tin soldering material or heat conductive glue. The inner wall of the liquid seal container 2 includes a capillary structure 20 adhered thereto. The capillary structure 20 is stacked to a predetermined thickness at one end of the liquid seal container 2, thereby forming a liquid seal region 200. The end of the liquid seal region 200 is preferably formed at the bottom end 21 of a normal heat pipe. Since the other end of the liquid seal container 2 is a sealing end 22, which is provided for injecting working fluid and evacuating the air contained therein. Therefore, the capillary structure 20 should not obstruct the sealing end 22. The capillary structure 20 on the inner wall of the liquid seal container 2 can be formed via powder sintering or by disposing a rolled-up metallic web 201 (as shown in FIG. 4). On the other hand, the liquid seal region 200 is formed via powder sintering.

Figure 5:
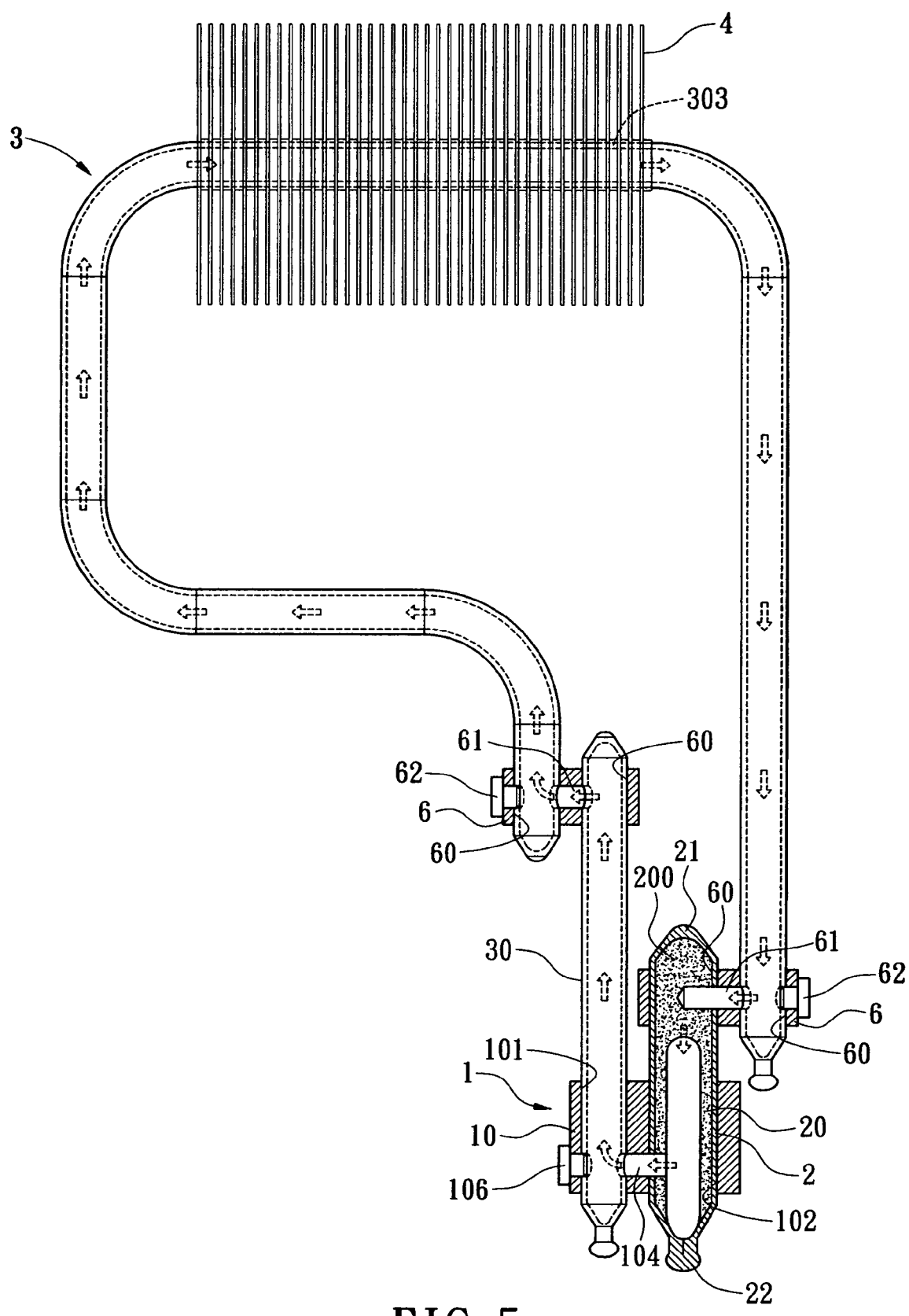
FIG. 5 is a sectional view illustrating a loop heat pipe, in accordance with the third embodiment of the present invention.

The sealed pipe 3 is composed of a pipe body 30 and/or two or more sequentially connected pipe bodies 30, 31 (as shown in FIG. 5). A capillary structure is formed on the inner wall of the pipe bodies 30, 31. In this particular embodiment, the sealed pipe 3 includes a pipe body 30, which forms a closed loop. The pipe body 30 includes two closed ends 300, 301. The two closed ends 300, 301 are inserted into the first and the third retaining holes 101, 103 of the evaporator body 10, respectively. Furthermore, the two closed ends 300, 301 of the pipe body 30 are fastened to the evaporator body 10 via soldering a heat conductive tin soldering material or applying a heat conductive adhesive. Later, the outer side of the evaporator body 10 is disposed into the channel holes 104, 105. Referring to FIG. 2 and FIG. 3, the channel holes 104, 105 are blind holes for the evaporator body 10, which penetrate only between the liquid seal container 2 and the two closed ends 300, 301. After the sealed pipe 3, the liquid seal container 2 and the evaporator body 10 are combined, the sealed pipe 3 forms a circulating loop through the presence of the channel holes 104, 105, as shown in FIG. 1. Meanwhile, a seal portion 106 is formed on the channel holes 104, 105 at the outer side of the evaporator body 10. The seal portion 106 can be a plug (as shown in FIG. 3) or a soldered structure formed by a soldering procedure (as shown in FIG. 4), so as to effectively seal the channel holes 104, 105 within the evaporator body 10.

When the sealed pipe 3, the liquid seal container 2 and the channel holes 104, 105 form a circulation loop, at least one of the first and the third retaining holes 101, 103 of the evaporator body 10 is a through hole penetrating the evaporator body 10. In this particular embodiment, both of the first and the third retaining holes 101, 103 are through holes. In this manner, at least one of the closed ends 301 of the sealed pipe 3 can protrude the evaporator 1 from the retaining hole 103. The closed ends 301 that protrudes the evaporator 1 is the seal end of the pipe body 30. Before the closed end 301 is sealed, one can perform the operations for cleaning, evacuating or exhausting the sealed pipe 3 and the channel holes 104, 105. Once such operations are completed, the closed end 301 is then sealed via shrinking, pressing and soldering the end, thereby forming sealed structures 302. In addition, the pipe body 30 includes one or more condensation regions 303, which can dispose a plurality of cooling fins 4 thereon.

In one end of the liquid seal container 2 of the present invention, a capillary structure 20 is stacked to form a liquid seal region 200, which allows the condensed working fluid to fill therein, thereby forming a liquid seal and an evaporating region of the largest possible area. In this manner, the evaporator of the present invention is low in thermal resistance, which can increase the heat transfer rate. Therefore, a loop heat pipe of good thermal property is obtained.

Consequently, a loop heat pipe of the present invention is obtained.

Furthermore, as shown in FIG. 5, a loop heat pipe in accordance with the third embodiment of the present invention is illustrated. In this particular embodiment, the sealed pipe 3 is composed of two or more pipe bodies 30, 31 sequentially connected to each other. Each pipe body 30, 31 is connected through a connection piece 6. The connection piece 6 provides the pipe bodies 30, 31 or the bottom portion of the liquid seal container 2 to penetrate the two connection holes 60, and the channel hole 61 penetrating the two connection holes 60. At the mean time, a sealed portion 62 is formed outside of the connection piece 6 and protruding the channel hole 61. The structure of the sealed portion 62 is similar to that of the evaporator 1. However, the connection piece 5 is not limited to be made of a heat conductive material. The primary function of the connection piece 5 is to communicably connection the pipe bodies 30, 31 and the liquid seal container 2, not contacting the heat source 5.

In summary, the loop heat pipe of the present invention indeed satisfies the patentability requirements of the patent law, a grant of letters patent therefore is thus respectfully requested.

Since, any person having ordinary skill in the art may readily find various equivalent alterations or modifications in light of the features as disclosed above, it is appreciated that the scope of the present invention is defined in the following claims. Therefore, all such equivalent alterations or modifications without departing from the subject matter as set forth in the following claims is considered within the spirit and scope of the present invention.

What is claimed is:

1. A loop heat pipe, comprising:
    an evaporator having an evaporator body made of a heat conductive material, the evaporator body comprising at least two retaining holes and at least a channel hole penetrating the retaining holes;
    a liquid seal container securely fastened to one of the retaining holes of the evaporator; and
    a closed loop comprising at least two closed ends, one of the closed ends being securely fastened to another retaining hole of the evaporator,
    wherein a capillary structure is adhered to the inner wall of the liquid seal container, and one end of the liquid seal container forms a liquid seal region using the capillary structure, the other closed end of the closed loop being connected to the liquid seal region.

2. The loop heat pipe as recited in claim 1, wherein the evaporator body is made of aluminum or copper.

3. The loop heat pipe as recited in claim 1, wherein the evaporator body comprises a contact surface for contacting a heat source.

4. The loop heat pipe as recited in claim 1, further comprising a third retaining hole formed on the evaporator body, whereby the other closed end of the closed loop is securely fastened to the third retaining hole.

5. The loop heat pipe as recited in claim 1, wherein at least one of the retaining holes of the evaporator is a through hole penetrating two sides of the evaporator, and at least a closed end protrudes the evaporator through the retaining hole.

6. The loop heat pipe as recited in claim 5, wherein a sealed structure is formed at the closed end that protrudes the evaporator.

7. The loop heat pipe as recited in claim 1, wherein a seal portion is formed on the top portion of the evaporator body at the channel hole of the evaporator.

8. The loop heat pipe as recited in claim 7, wherein the seal portion comprises a plug, or a soldered structure formed by a soldering procedure.

9. The loop heat pipe as recited in claim 1, wherein the capillary structure on the inner wall of the liquid seal container is formed of a soldered powder or a metallic web.

10. The loop heat pipe as recited in claim 1, wherein the capillary structure of the liquid seal region of the liquid seal container is formed of a soldered powder or a metallic web.

11. The loop heat pipe as recited in claim 1, wherein the liquid seal container and the other closed end of the closed loop are connected via a connection piece, the connection piece comprising two connection holes for the liquid seal container and the other closed end to penetrate therethrough, and a channel hole penetrating the connection holes.

12. The loop heat pipe as recited in claim 1, wherein the closed loop comprises a bent pipe body.

13. The loop heat pipe as recited in claim 1, wherein the closed loop comprises two or more pipe bodies sequentially connected with each other.

14. The loop heat pipe as recited in claim 13, wherein a connection piece is used to connect each pair of the pipe bodies, the connection piece comprising two connection holes for the pipe bodies to penetrate therethrough, and a channel hole penetrating the connection holes.

* * * * *